(12) United States Patent
Mallinson

(10) Patent No.: US 7,197,522 B2
(45) Date of Patent: Mar. 27, 2007

(54) BI-QUAD DIGITAL FILTER CONFIGURED WITH A BIT BINARY RATE MULTIPLIER

(75) Inventor: Andrew Martin Mallinson, Kelowna (CA)

(73) Assignee: ESS Technology, Inc., Fremont, CA (US)

(*) Notice: Subject to any disclaimer, the term of this patent is extended or adjusted under 35 U.S.C. 154(b) by 705 days.

(21) Appl. No.: 10/453,901

(22) Filed: Jun. 2, 2003

(65) Prior Publication Data
US 2004/0193665 A1 Sep. 30, 2004

Related U.S. Application Data

(60) Provisional application No. 60/458,901, filed on Mar. 28, 2003.

(51) Int. Cl.
*G06F 7/68* (2006.01)

(52) U.S. Cl. ..................................... 708/103

(58) Field of Classification Search .................. None
See application file for complete search history.

(56) References Cited

U.S. PATENT DOCUMENTS

| | | | | |
|---|---|---|---|---|
| 3,701,890 A | * | 10/1972 | Dummermuth | ............ 708/102 |
| 3,806,718 A | * | 4/1974 | Stewart | ...................... 708/103 |
| 4,117,541 A | * | 9/1978 | Ali | .............................. 708/320 |
| 4,145,743 A | * | 3/1979 | DiCiurcio | ...................... 708/6 |
| 4,209,771 A | | 6/1980 | Miyata et al. | |
| 4,209,773 A | | 6/1980 | Everard | |
| 4,484,178 A | | 11/1984 | Lovgren et al. | |
| 4,646,322 A | * | 2/1987 | Flanagin et al. | ............ 375/244 |
| 4,834,374 A | * | 5/1989 | Nakamura et al. | ............ 463/33 |
| 4,961,059 A | * | 10/1990 | Anderson | ..................... 333/19 |
| 6,031,428 A | | 2/2000 | Hill | |
| 6,072,843 A | | 6/2000 | Baker et al. | |
| 6,076,096 A | * | 6/2000 | Salomon et al. | ............ 708/103 |
| 6,590,733 B1 | * | 7/2003 | Wilson et al. | ............ 360/77.14 |

OTHER PUBLICATIONS

Weller, Pulse-Code Modulation to Voice Conversion-Binary Rate Multiplier Differential Pulse-Code-Modulator Decoder, IEEE Transactions On Communication Technology, Dec. 1971, vol. col. 19, No. 6, pp. 1064-1069.

Consumer Microcircuits Limited, FX-209 Adaptive Delta Modulation Encoder or Decoder, Pre-Publication Product Information Extract.

Johns D A et al, "Highly Selective Analog Filters Using /spl Delta spl Sigma/ Based IIR Filtering," Proceedings of the International Symposium on Circuits and Systems Chicago, May 3-6, 1993, New York, IEEE, US, vol. 2, pp. 1302-1305, ISBN: 0-7803-1281-3.

(Continued)

*Primary Examiner*—D. H. Malzahn
(74) *Attorney, Agent, or Firm*—Haynes Beffel & Wolfeld LLP

(57) ABSTRACT

The invention is directed to a bi-quad filter circuit configured with sigma-delta devices that operate as binary rate multipliers (BRMs). Unlike conventional bi-quad filter circuits, the invention provides a bi-quad filter configured with a single-bit BRM. In another embodiment, the invention further provides a bi-quad filter configured with multiple-bit BRMs.

1 Claim, 7 Drawing Sheets

OTHER PUBLICATIONS

Johns D A et al, "Design and Analysis of Delta-Sigma Based IIR Filters," IEEE Transactions on Circuits and Systems II: Analog and Digital Signal Processing, IEE Inc, New York, US, vol. 4, No. 4, Apr. 1993, pp. 233-240, ISSN: 1057-7130.

Fernandes L et al, "Programmable IIR Bitstream Filters," Circuits and Systems, Proceedings of the 38th Midwest Symposium on Rio De Janeiro, Brazil Aug. 13-16, 1995, New York, NY, USA, IEE, vol. 1, pp. 576-579, ISBN: 0-7803-2972-4.

* cited by examiner

BI-QUAD DIGITAL FILTER CONFIGURED WITH A BIT BINARY RATE MULTIPLIER

RELATED APPLICATIONS

This application claims the benefit of U.S. Provisional Application Ser. No. 60/458,901, filed on Mar. 28, 2003.

BACKGROUND

This invention generally relates to a filter circuit configuration for digital signal processing and, more particularly, to a binary rate multiplier (BRM) filter in a bi-quad configuration.

Analog-to-digital converters (ADCs) are well known in the art, and are configured to convert an analog signal to a digital signal. The sigma delta conversion technique is a low cost ADC conversion method that provides both high dynamic range and flexibility in converting low bandwidth input signals.

In order to obtain a high quality digital signal as a result of AD conversion, various techniques may be used to reduce noise or error. For example, an electronic filter may be used to distribute the converter quantization error or noise such that it is very low in the band of interests. Over sampling is another method of decreasing the quantization noise by sampling the input signal at a frequency much greater than the Nyquist frequency (two times the input signal bandwidth). Similarly, decimation reduces the input signal sampling rate without loosing information. An on-chip digital filter can also be used to attenuate signals and noise that are outside the band of interest according to the parameters of a particular application.

An electronic filter is designed to transmit some range of signal frequencies while rejecting others, i.e., to emphasize or "pass" certain frequencies and attenuate or "stop" others. A digital filter has two types depending on whether the impulse response contains a finite or infinite number of nonzero terms. A finite impulse response (FIR) filter can be designed to be linear phase, a characteristics that ensures that a filter has a constant group delay independent of frequency. An infinite impulse response digital filter requires much less computation to implement than a FIR filter with a corresponding frequency response. However, IIR filters cannot generally achieve an adequate linear-phase response and are more susceptible to finite word length effects, which may result in round-off noise, coefficient quantization error and overflow oscillations. In addition, FIR filters require more bit width, up to 50 bits in practice, which can be burdensome to a circuit. "Bit width" refers to the width of the bits that must be processed in parallel and is the "data path width" of the digital implementation.

Therefore, there exists a need for a filter that has an accuracy similar to that of a FIR filter, but that requires less bit width.

BRIEF DESCRIPTION OF THE DRAWINGS

The invention is illustrated by way of example and not limitation in the figures of the accompanying drawings. The same numbers are used throughout the figures to reference like components and/or features.

DETAILED DESCRIPTION

Figure 1:
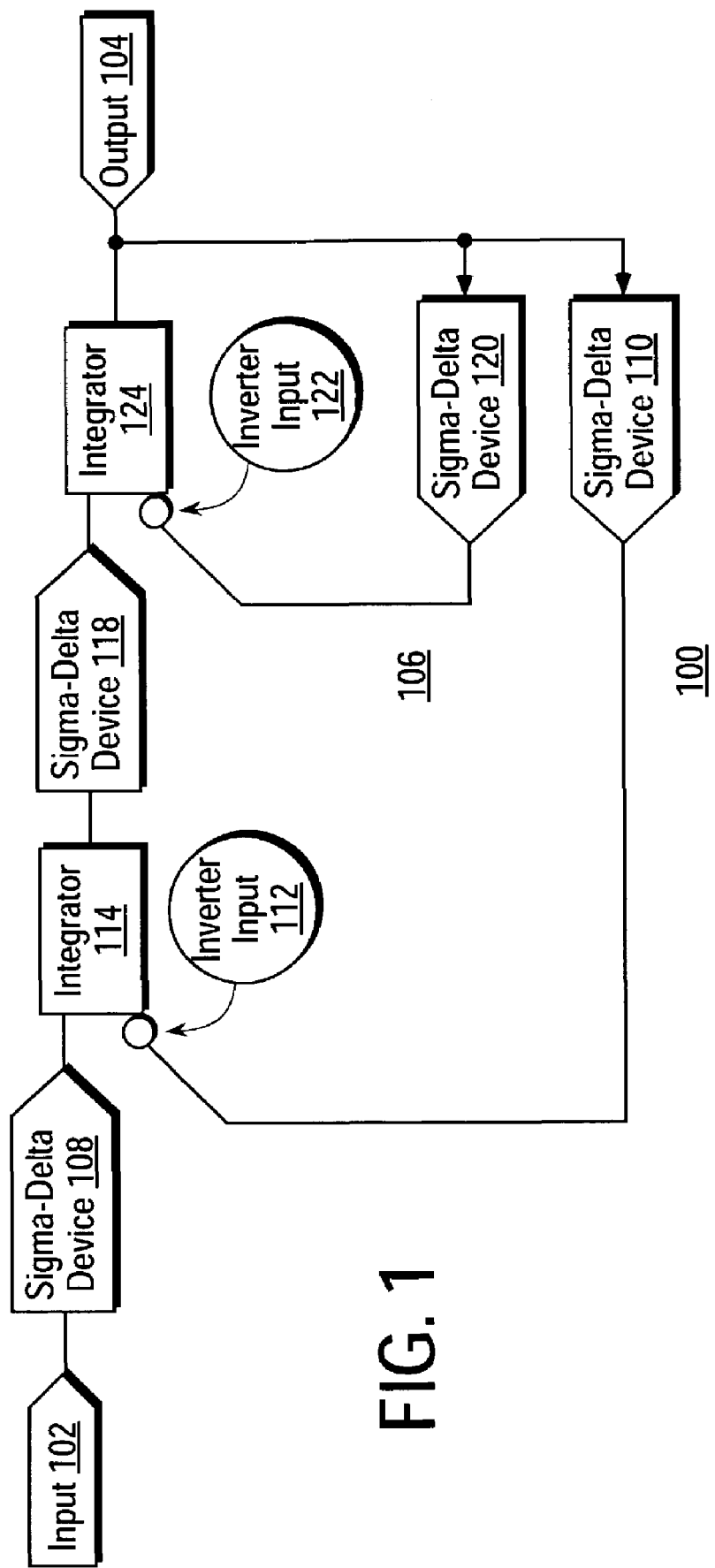
FIG. 1 is a schematic diagram of a bi-quad filter circuit according to one embodiment of the invention.

The invention is directed to a bi-quad filter circuit 100, FIG. 1, configured with sigma-delta devices 108, 118, 110 and 120, that operate as binary rate multipliers (BRMs). A bi-quad circuit is an active filter whose transfer function comprises a ratio of second-order numerator and denominator polynomials in the frequency variable. Unlike conventional bi-quad filter circuits, the invention provides a bi-quad filter configured with a single-bit BRM. In another embodiment, the invention further provides a bi-quad filter configured with multiple-bit BRMs.

Unlike conventional filters, a circuit configuration according to embodiments of the invention provides comparable accuracy to that of a conventional FIR filter with significantly less bit width. Throughout the circuit, signal processing techniques are used to represent the input signal as a succession of output states of a BRM. In conventional circuits, the input is represented as a digital or analog signal, where the representation is over an instant of time. In contrast, a circuit configured according to the invention takes an average value over a period of time.

In practice, a circuit configuration according to the invention requires only 24 bit or 32 bit data path width to perform well in most applications. A circuit configured according to the invention provides a simple and easy way to use a physically small but high quality filter implemented on a time constant as a small fraction of the clock rate.

Examples as described below pertain to audio signal processing. It will be appreciated, however, that this is illustrative of only one utility of the invention, and that the invention has greater applicability. It will be appreciated by those skilled in the art that the invention is applicable to any type of digital signal processing technology including but not limited to acoustic signal processing, image signal processing, and multi-dimensional signal processing, without departing from the spirit and scope of the invention, which is defined in the appended claims and their equivalents.

A BRM is a device that accepts two inputs, where one is the frequency or rate input to be modified, the other is a data word indicating the multiplier factor to be applied to the input rate. For example, the rate input may be a signal at 1 Mhz, and the factor input may be a number such as 100 expressed on an 8 bit bus, thus representing the factor 100/256. Operation of the BRM results in an output frequency of 1 Mhz * 100/256 or about 390 khz. Such binary rate multiplying devices are well known in the art.

However, the invention further provides extension to the BRM as a multi-bit BRM. A single bit BRM of the common type can be constructed as a modulo arithmetic sigma delta modulator of the first order, which is described below in connection with FIGS. 4 and 5. A sigma delta modulator of the first order is illustrated in FIG. 2 and as such operates as a BRM.

Figure 2:
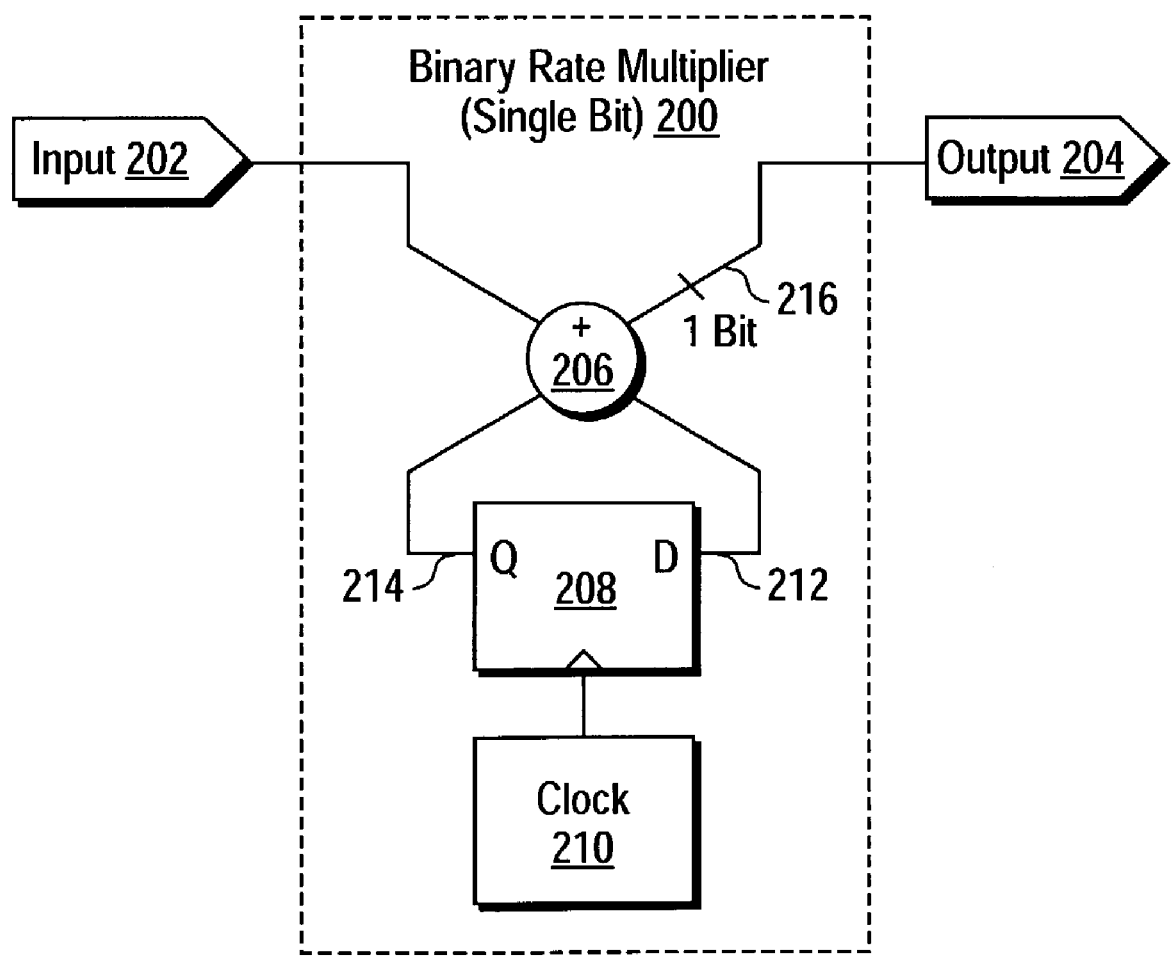
FIG. 2 is a block diagram of a single bit binary rate multiplier (BRM).

Referring now to FIG. 2, a BRM, or equivalently, the first order modulo arithmetic sigma delta modulator as previously described, is illustrated. The BRM includes an input 202 for receiving an input signal and an output 204 for outputting a binary rate signal. The input signal is transmitted to a digital adder 206. The adder is connected to a flip flop 208, which is connected to a clock 210. The adder transmits an output signal to flip flop D input 212. The clock transmits a clock pulse of a predetermined frequency to toggle the Q output bus 214 of the flip flop. The adder then adds the input signal to the signal received from the Q output bus 214 of the flip flop, and outputs a sum signal back to the D input 212 of the flip flop and a carry output 216 to the output 204.

Figure 3:
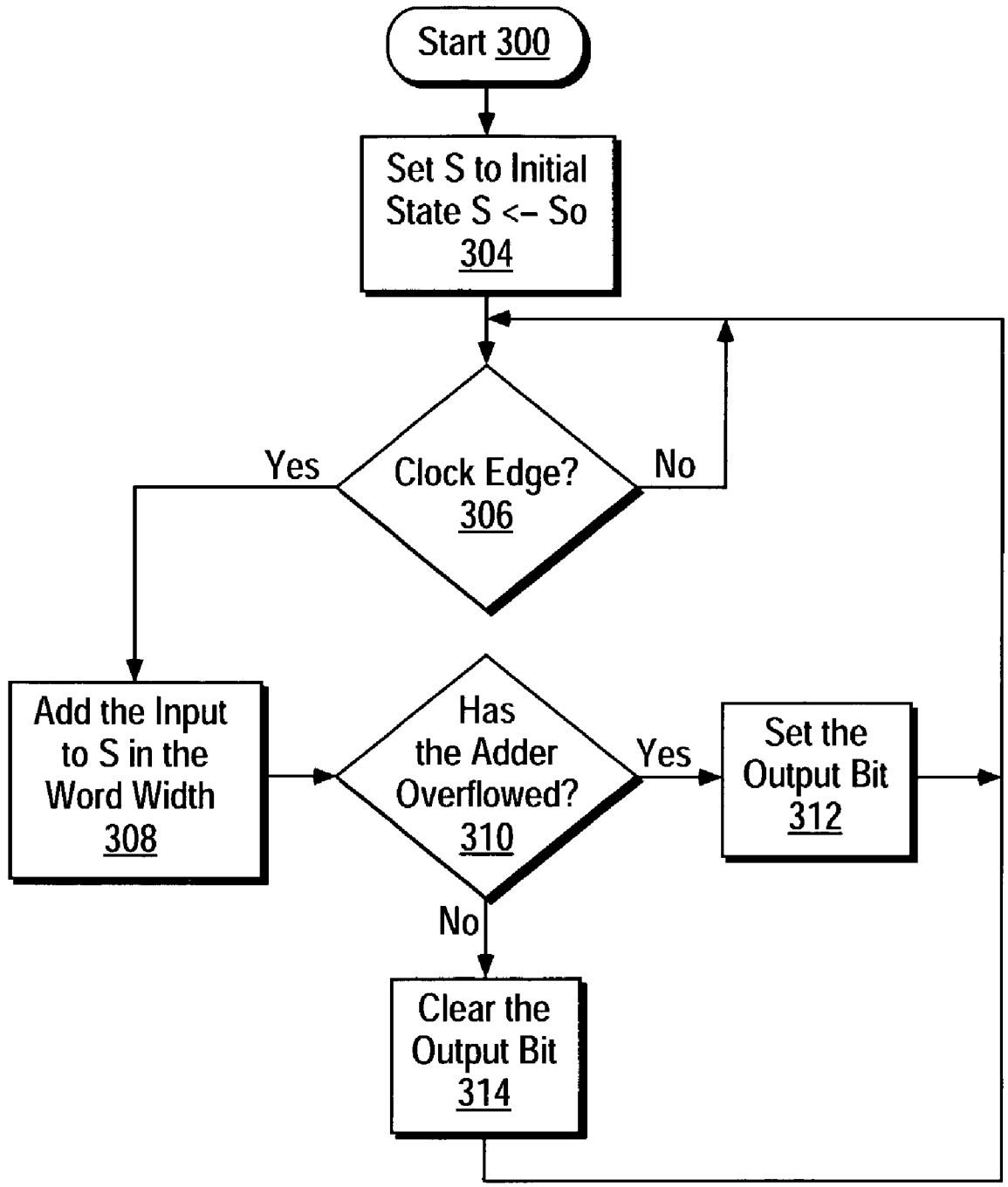
FIG. 3 is a flow chart illustrating the function of the BRM of FIG. 2.

Referring to FIG. 3, a flow chart is shown illustrating the function of a single bit BRM implemented as a modulo arithmetic sigma delta modulator. The process starts at step 300. The output S of the adder 206 (FIG. 2), is set to an initial state, S←$S_0$, in step 304. Then, step 306 queries whether a clock edge is present, where the clock edge triggers the addition function. If not present, it continues to wait in step 306. Once the clock edge is present, in step 308, the input signal is added to the output S of the adder 206, which is taken from the flip flop 208. In step 310, there is a query of whether the adder 206 has overflowed. If it has overflowed, in step 312, the output carry bit is set, and an output carry signal is transmitted to output 204. If the adder has not over flowed, then, instep 314, the carry output bit is cleared, and a carry bit is not transmitted to output 204. In either case, the process returns to step 306 and waits for the next clock edge before the adder resumes function.

In operation, if the bus width to the adder is eight bits, then the input N=128 ($2^7$), causes the carry output to alternate bits (0,1,0,1...). Thus, the density of the outputs is 50%. As N approaches 256, the density tends to 100%. As N approaches 0, the density tends to 0%. Thus, the BRM outputs at a rate that is proportional to the clock frequency and the input signal frequency, or f=(N/256) $f_{clk}$. Thus the input of the BRM creates the density of logical zero and logical one values at the output. The BRM generates a single bit signal that expresses a signal In the form of successive states of the BRM over time.

Referring again to FIG. 2, the operation of the BRM will be further described. The register with input 212 and output 214 is connected with adder 206. At each clock cycle the register will present at the bus 214 the contents of bus 212. Bus 212 is connected to the adder output that generates a sum of the input signal and the output signal from the flip flop Q output 214. This output will assume the value that is the sum of the bus 214 and the input signal 202. If any overflow occurs in this addition process, a carry bit will be transmitted to output 204 via carry output 216.

For the purpose of illustration of the operation of a practical circuit, it can be assumed that the bus widths 214, 212 and 202 are all 8 bits wide. Initially, it is assumed that the register initially contains 0 and the input bus 202 contains the number 128. Thus flip flop input 212 also has the number 128 since it is adding 214 and (the register output) and 202 the register input. The carry output 204 is at this time not set (it is 0) since the sum of 128 and 0 does not overflow in an 8 bit word. Upon the next clock the bus 214 assumes the value of the bus 212, and hence 212 will now have to encode not 0+128 as before the clock, but 128+128=256, since 128 is now preset at the 214 bus. However, 256 cannot be encoded in an 8 bit word. Hence, the carry output 216 will be set and the bus 212 will in fact hold the residue of the sum modulo 256, thus it will encode 0. The time the carry output 204 is set, it is at logic 1. Upon the next clock signal, the register output 214 assumes the value 0 that was preset on the 212 bus, thus the register output 214 is returned to the initial state and the carry output 204 is not set, it is logic 0. Subsequent pulses of the clock will result in the carry output generating the sequence 01010... Therefore, by application of the number 128 on the bus 202, the sequence 010101 is generated on the carry output 204. If the input bus 202 were to encode the number 64 the sequence of carry outputs would be 000100010001 etc. Observing this operation, the circuit generates a rate of output carry signals to output 204 that is proportional to the number input signal received on the input bus 202. The device therefore operates as a binary rate multiplier, and the output rate is $F_{clk}$*/N/256, where $F_{clk}$ is the rate of applied clock to the register and N is the number on the input bus 202.

This device illustrated in FIG. 2 has described as a binary rate multiplier that generates as single bit output. This is similar in operation to a first order Sigma Delta (ΣΔ) Modulator. It can be characterized as a first order sigma delta modulator implemented as a modulo arithmetic device. A modulo arithmetic device is one where math operations are performed in a finite bus width and the expected overflow of the math operation is utilized as a part of the executed algorithm.

As an aid to understanding, consider that the BRM device is creating a single bit, where the single bit produced is either logic high or logic low (or, a value of 1 or 0 respectively). However, the percentage time spent high or low is proportional to the input number. For example, it has been observed that, for an 8 bit device, 128 results in 010101, 64 results in 00010001, etc. The percentage time, known in the art as the duty cycle, is proportional to the input number. In a circuit designed according to the invention, the fact that the average value of the output bit is the signal of interest to be processed is exploited. However, because that signal has only 1 bit it is easy for us to process it, the logic required is small. The alternative would be to process the input word, in this case 8 bits.

Referring again to FIG. 1, a bi-quad configured filter 100 is illustrated. According to one embodiment of the invention, the filter 100 includes an input 102, an output 104, and a feedback loop 106 communicating with a sigma-delta device 108. The filter further includes a feedback loop 106 that feeds back an output signal from sigma-delta device 110 to the inverter input 112 of an input integrator 114. The output of the input integrator is then transmitted to sigma-delta device 118. The signal is then integrated with a signal that is fed back through a sigma-delta device 120 and into inverter input 122 into integrator 124. In operation, an input signal is fed into the first sigma-delta device 108, then processed in the bi-quad configured sigma-delta loop 106 and finally output at the output 104. Those skilled in the art will recognize that this loop is a second order feedback loop, the two integrators being 114 and 124, the overall feedback operation being performed by the sigma delta device 110 and a damping term provided by device 120. More details of this process are discussed below in connection with other embodiments.

Figure 4:
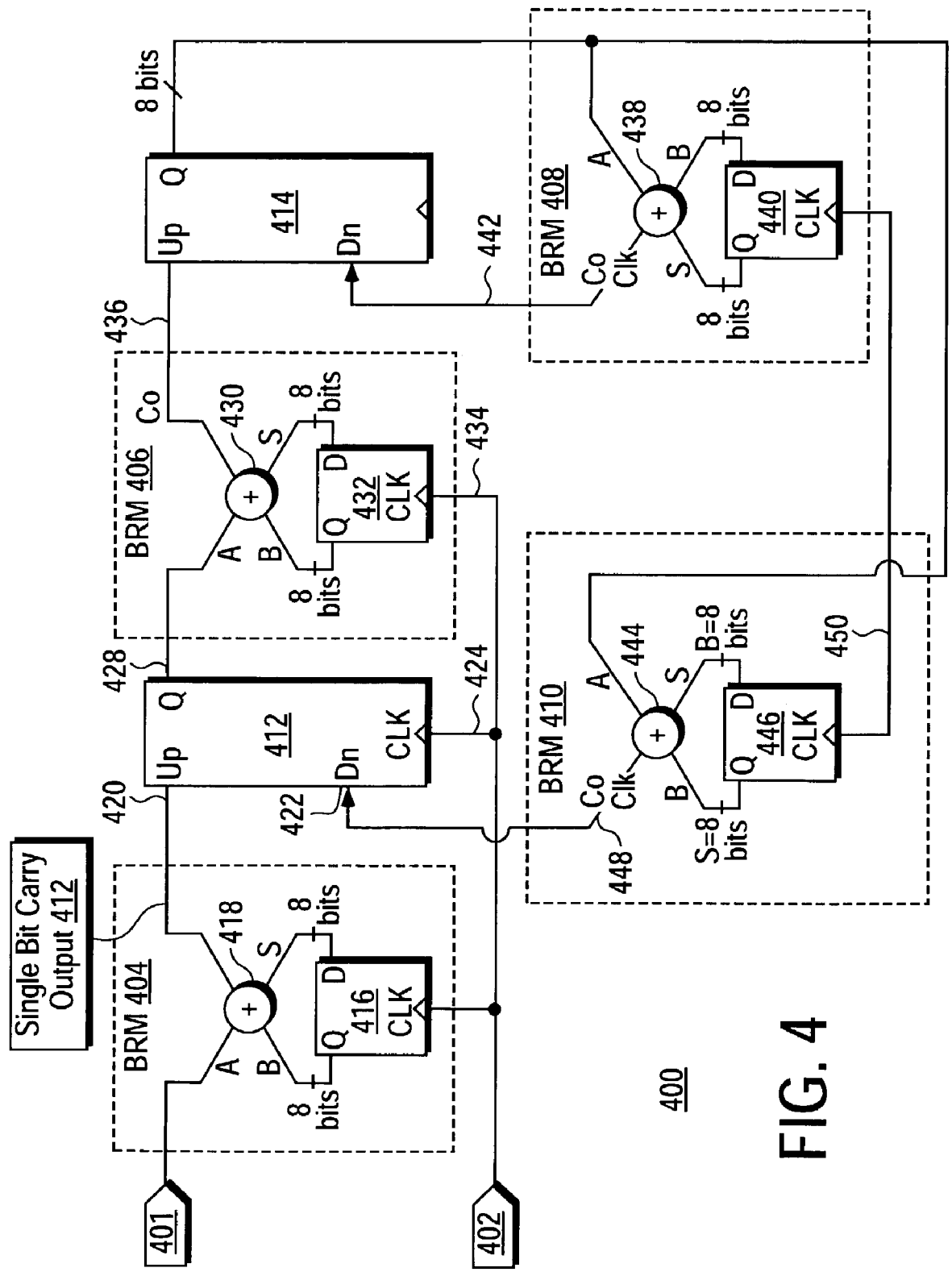
FIG. 4 is a schematic diagram of a bi-quad filter circuit configured with a single bit binary rate multiplier according to one embodiment of the invention.

Referring to FIG. 4, a bi-quad filter is shown configured with a BRM of FIG. 2 according to one embodiment of the invention. The filter 400 includes an input 401, a reference clock 402, a series of single bit BRM processing units 404, 406, 408, 410, and two up/down counters 412, 414. Each BRM 404 includes a flip flop register 416 and a multiple bit adder 418.

An input 401 is connected to a single bit BRM processing unit 404, where an input signal is received at an input of adder 418. The adder outputs a summation signal to the D input of the flip flop 416. The flip flop outputs an output signal at the Q output according to a clock signal received from the system clock 402. The output signal from the output Q of the flip flop is added to the input signal in the adder 418. When a sum is larger than 8 bits, a single bit carry output signal is output to the up port of the up/down counter 412. A reference clock signal input 402 clocks the flip flop and the up down counter 412.

An up/down counter 412 includes two inputs, an "up" input 420 and a "down" input 422, an output Q 428 and a clock input 424. An "up" input 420 and a "down" input 422 are connected to an adder carry output 413. Reference clock signal 402 clocks an up/down counter 412 at a clock input 424. The up/down counter 412 increments or decrements on the edge of clock as the following table.

| UP | Down | Next Q Output |
|---|---|---|
| 0 | 0 | $Q_n$ |
| 0 | 1 | $Q_n - 1$ |
| 1 | 0 | $Q_n + 1$ |
| 1 | 1 | $Q_n$ |

The $Q_n$ represents the output of the un/down counter for a given input. If the output is $Q_n$, the output remains unchanged. If the output is $Q_n+1$, the output increments. If the output is $Q_n-1$, the output is decremented. So, for example, if the counter is receiving a logic low at both "up" input 420 and "down" input 422, the counter 412 outputs $Q_n$, i.e. it remains unchanged. If receiving a logic low at an "up" input 420 and a logic high at "down" input 422, the counter outputs $Q_{n-1}$, i.e. it decrements by one count from it's previous value it is now 1 bit less than $Q_n$. If receiving a logic high at an "up" input 420 and a logic low at a "down" input 422, the counter outputs $Q_{n-1}$, i.e. it increments by one count from the previous value. If receiving a logic high at both "up" input 420 and a "down" input 422, the counter outputs $Q_{n+1}$.

In operation, the first BRM 404 receives an input signal from input 401 at adder input A, where it is added to the flip flop output Q. The sum output is input back into the flip flop input D, where it is toggled according to the system clock 402. As the values cycle through the adder and the flip flop, if a sum exceeds 8 bits, a carry output is transmitted to counter 412.

The process is similarly repeated in BRM 406, where the output Q 428 of the counter 412 is transmitted to adder input A, and added to the flip flop 432 output Q. The sum is input to flip flop input D, and the cycle continues according to the clock input 434, which receives a clock signal from reference clock input 402. As sums exceed 8 bits, a carry is set, sending a carry signal Co via carry output 436 to the Up input of counter 414. The counter 414 operates according to the same input scheme as counter 412 discussed above. The output of counter 414 is input to third BRM 408. Third BRM 408 receives the Q output of counter 414 as an input to the adder 438, and adds the input to the D input of the flip flop 440. As the BRM 408 cycles, and as sums exceed 8 bits, the output carry, Co 442, is transmitted to the Dn input of counter 414. Similarly, fourth BRM 410 receives the output Q of counter 414, inputs it to adder 444's A input, and adds it to the Q output of flip flop 446. The D input receives the sum S from adder 444, where it is toggled according to a reference clock CLK, and the Q output is added to the input A in adder 444. As sums exceed 8 bits, a carry signal, Co at output 448, is transmitted to the Dn input 422 of counter 412. Thus, FIG. 4 illustrates an implementation of a bi-quad circuit of FIG. 1, where the sigma delta devices are single bit BRMs. The clock input line 450 clocks flip flops 440, 446, and may be tied to the system clock. Thus, the input 401 corresponds to the density of logical zeros and logical ones at the output, which is the output Q of counter 414. Throughout the circuit, signal processing techniques are used to represent the input signal as a succession of output states of a BRM.

Referring again to FIG. 1, a schematic diagram of a bi-quad circuit configured with a multiple-bit binary rate multiplier according to one embodiment of the invention is illustrated. A bi-quad circuit configuration 100 in FIG. 1 is an alternative embodiment to the bi-quad section of FIG. 4. In operation, a signal X is received at input 102.

The integrators 114 and 124 form a loop that is damped by the feedback path including the sigma delta device 108. Define first $k=2^{m-n} \cdot f_{clk}$ for each of the sigma delta devices where n is the number of bits in the integrator and m the number of bits in the output of the sigma delta device. Given this definition of k, and assume a notes the output at the first integrator and s the derivative operator, then:

$$s \cdot y = k3 \cdot a - k1 \cdot y \text{ and } s \cdot a = k2 \cdot x - k2 \cdot y$$

After a is substituted for in the second equation:

$$s^2 y + s \cdot k1 \cdot y + k2 \cdot k3 \cdot y = k2 \cdot k3 \cdot x$$

Consequently the denominator of the transfer function is:

$$s^2 + s \cdot k1 + k2 \cdot k3$$

which by comparison to the w, q form of the second order transfer characteristic $$s^2 + s \cdot \frac{w}{q} + w^2 \text{ shows that } q = w/k1, w = \sqrt{k2 \cdot k3}$$

In terms of m again, w, q are:

$$w = \frac{\sqrt{2^{m2} \cdot 2^{m3}}}{2^n} \cdot f_{clk} \text{ or } w = 2^{[(m2+m3)/2]-n} \cdot f_{clk}$$

$$q = \frac{\sqrt{2^{m2} \cdot 2^{m3}}}{2^{m1}} \text{ or } q = 2^{[(m2+m3)/2]-m1}$$

m1,m2,m3 are constrained and must be integers less than n so the method to derive m given w, q will not be exact but must find an integer near the ideal values. Note also that w may conveniently be expressed as a fraction of $f_{clk}$ by defining $w_f = w/f_{clk}$.

The following sample LISP code illustrates the use of this definition of $w_f$ and is configured to find appropriate values of m with a sample heuristic:

```
(defun bi-quad-m1-m2-m3 (Wf Q N)
    (let* ((wlog-term (round (* 2 (+ N (log Wf 2)))))
           (m2 (floor wlog-term 2))
           (m3 (ceiling wlog-term 2))
           (m1 (ceiling (- (* 0.5 (+ m2 m3)) (log Q 2))))
           (acheived-w (expt 2 (- (* 0.5 (+ m2 m3)) N)))
           (acheived-q (expt 2 (- (* 0.5 (+ m2 m3)) m1))))
        (values m1 m2 m3 acheived-w acheived-q)))
```

By taking the floor for m2 and the ceiling for m3 and error in the values will not accumulate and (m2+m3)/2 will more closely approximate the ideal. In the choice of achievable m1, the heuristic errs on the side that will reduce the q of the resulting pole pair by using the ceiling function (whose second argument defaults to 1).

In an alternative embodiment of the invention, an additional correspondence between a BRM and a sigma delta modulator may be exploited: namely that a multi-output level sigma delta device of the first order may also be considered to be a BRM. According to the invention, the BRM does not have a single bit output encoding 0 or 1, but a multi bit output. For example, a BRM may be configured to process 4 bits, allowing an encoding of 1 of 16 possibilities. This multi-bit BRM may also be incorporated into the bi-quad filter discussed above in place of the single bit BRM. This will again afford an advantage in the design of the digital filters. The multi-bit BRM may be utilized because the time constant involved may then be higher relative to the clock.

Figure 5:
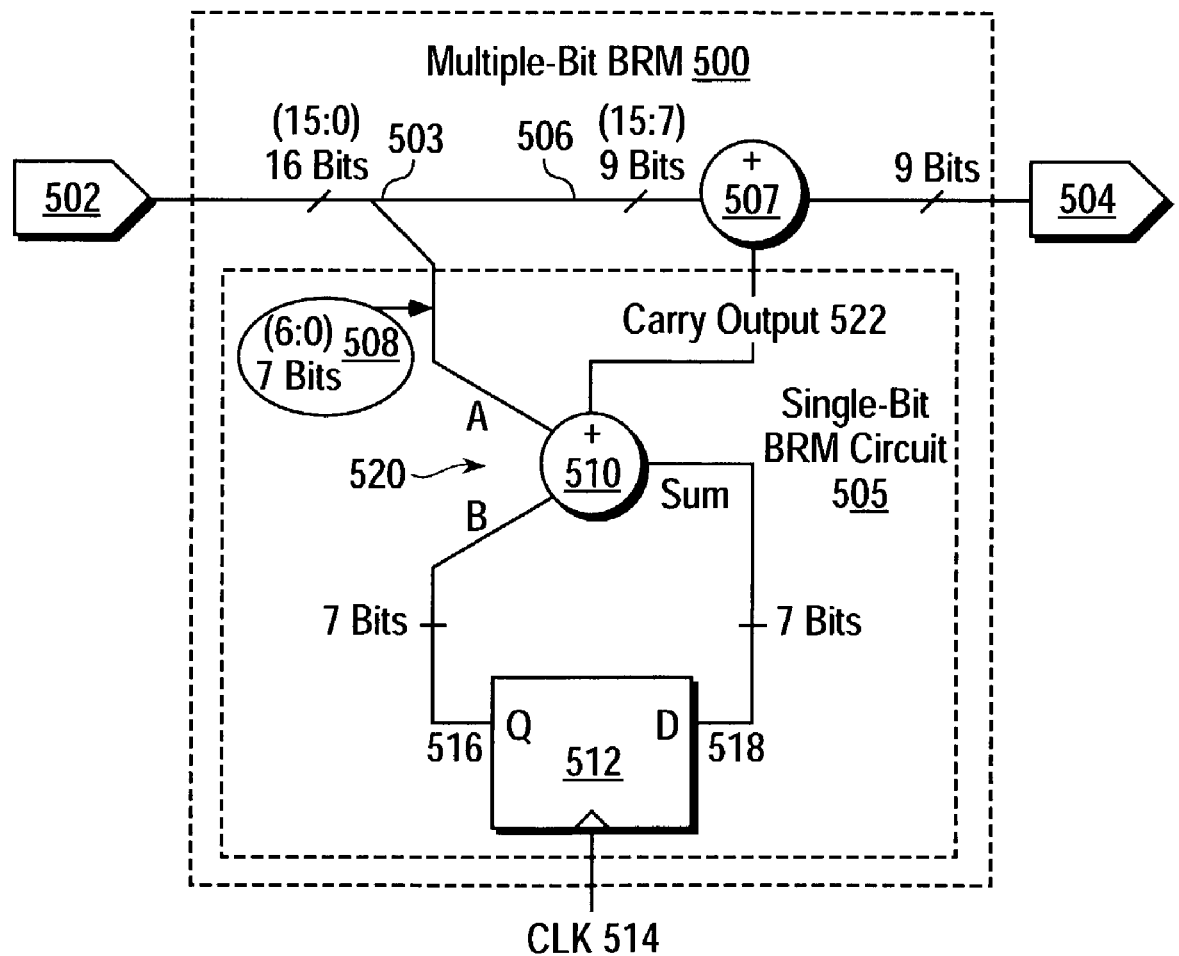
FIG. 5 is a block diagram of a multi-bit binary rate multiplier (BRM) according to the invention.

Referring now to FIG. 5, an example of a multiple bit BRM 500 is illustrated. All component include system clock, CLK, which may be universally clocked together, or separately depending on the application. The description below assumes they are clocked together. The circuit is configured to receive an input 502 of 16 bits and an output of 9 bits at output 504. The BRM 500 is illustrated as a 16 bit configuration. However, this bit size is only illustrative, and those skilled in the art will recognize that various numbers of bits can be utilized to configure such a circuit. The input signal is received and split at junction 503. A first sub-byte portion, the upper 9 bits 506, are passed to adder 507. A second sub-byte portion, the lower 7 bits 508, are fed into the single bit BRM circuit 505, such as the BRM circuit 200 of FIG. 2 discussed above. In a preferred embodiment, the most significant bits, portion A of the input word, are sent to the adder 507 to be combined with any carry output from adder 510. And, portion B is taken from the least significant bits of the input word. In mathematical terms, A is floor (Input, N) or A =(Input>>N), and B is residue(input, N), or B=Modulus(input, M). The carry output from the BRM circuit 505 is added to the upper 9 bits with adder 507. The single bit BRM circuit 505 operates similar to the BRM 200 of FIG. 2. The adder 510 is connected to D-type flip flop 512 that is clocked by clock circuit 514, and that has a D input 518 and a Q output 516. The adder inputs 520 include the lower 7 bits 508 that are added to the 7-bit output Q 516 of the flip flop. The carry output 522 of the BRM is then added to the upper 9 bits 506 in adder 507. The multiple bit BRM may be configured within a bi-quad filter, similar to those discussed above, operating as successive states of the multiple bit BRMs, operating within a larger fraction of the reference clock, where more bits are processed at a given time. In operation, if the single bit BRM output is 0, then the upper 9 bits make the output. If the single bit BRM output is 1, then the upper bits are incremented by 1. Thus, the 9 output bits dither between M and M+1 in proportion to the fraction in the lower bits.

Figure 6:
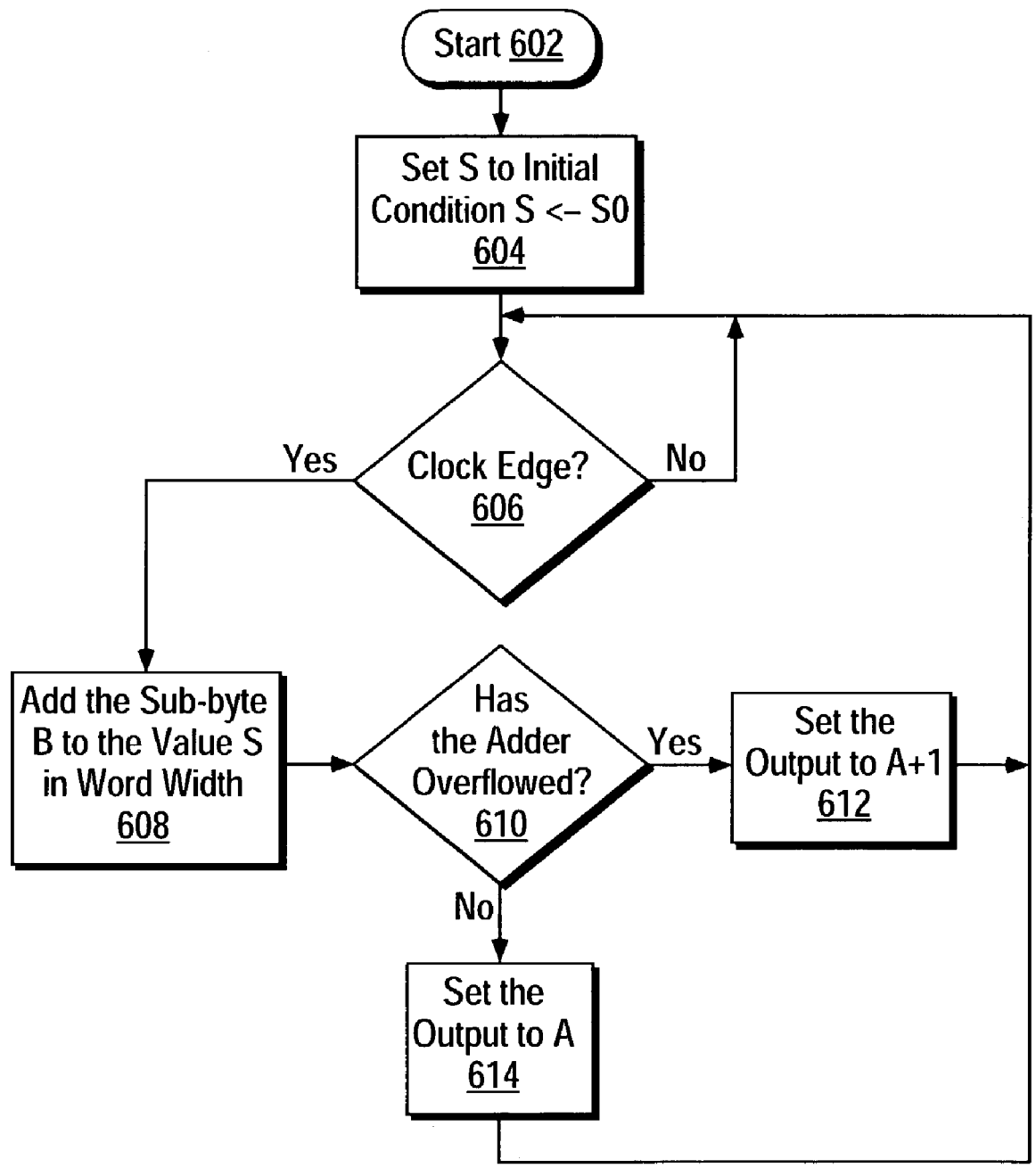
FIG. 6 is a flow chart illustrating the function of the multi-bit BRM of FIG. 5.

Referring to FIG. 6, a flow chart 600 illustrating the function of a multi-bit BRM is shown. Initially, the input word is split as discussed above, where a first sub-byte portion of bits are sent to adder 507, and a second sub-byte portion is sent to adder 510. In the single bit BRM circuit, which is a sub-circuit 505 of the multiple bit BRM, the process begins at step 602, and the output S of the adder 510 (FIG. 5), is set to an initial state, S←$S_0$, in step 604. Then, step 606 queries whether a clock edge is present, where the clock edge triggers the addition function. If not present, it continues to wait in step 606. Once the clock edge is present, in step 608, the sub-byte portion of the input signal is added to the output S of the adder 510 (which is taken from the flip flop 512 ). In step 610, there is a query of whether the adder 510 has overflowed. If it has overflowed, in step 612, the output is set to A+1, which is the summation of the first sub-byte portion of the input word and the carry bit from carry output 522, and an output carry signal is transmitted to output 504. If the adder has not over flowed, then, instep 614, the carry output bit is cleared, and a carry bit is not transmitted to adder 507. The output then is simply A, or the first sub-byte portion of the input word. In either case, the process returns to step 506 and waits for the next clock edge before the adder resumes function.

Figure 7:
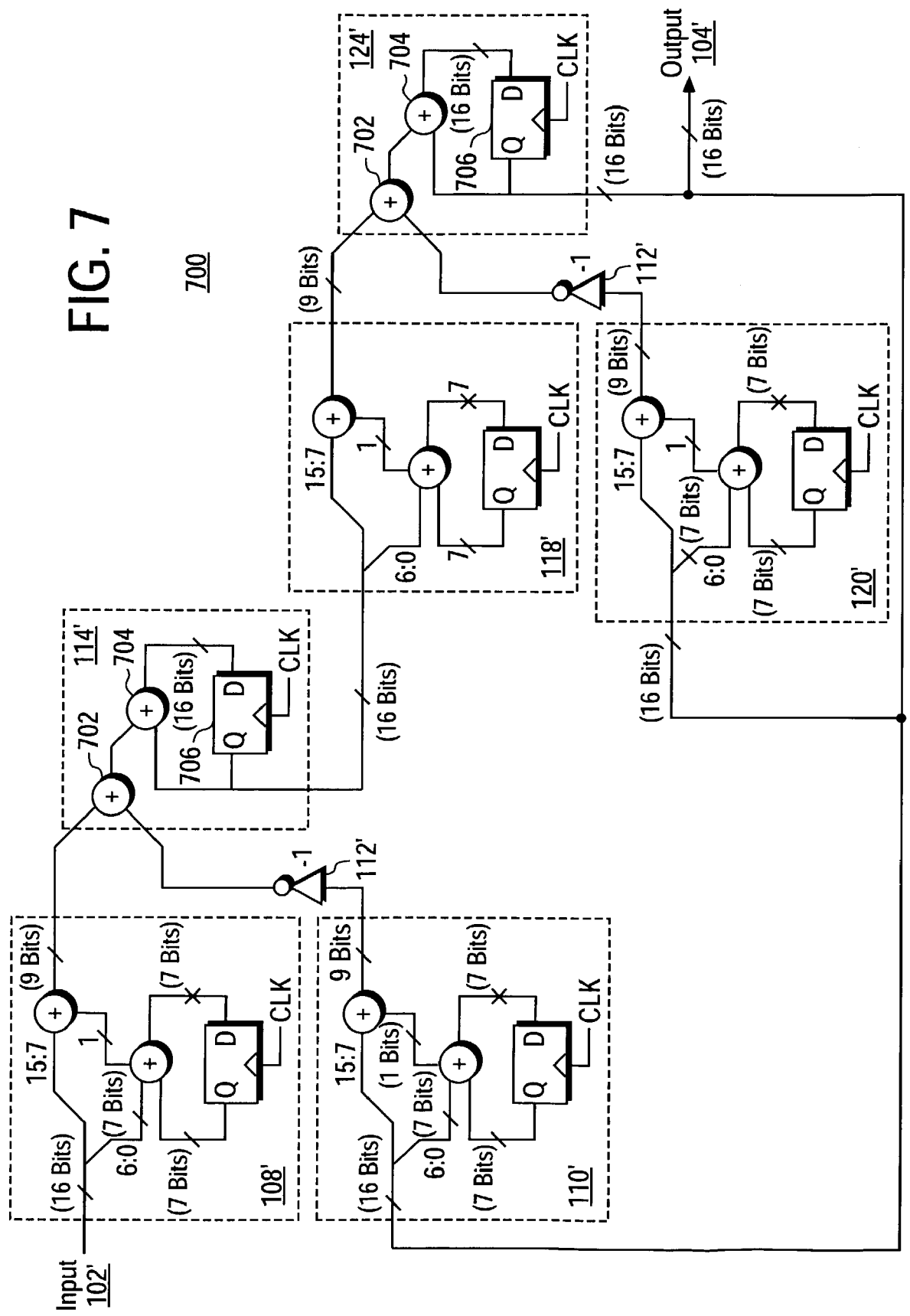
FIG. 7 is a block diagram of a bi-quad filter circuit configured with a multiple-bit binary rate multiplier according to one embodiment of the invention.

A multiple bit circuit can be used in the circuit of FIG. 1 as the sigma delta devices. FIG. 7 illustrates one example of such a circuit. Referring to FIG. 7, another embodiment of the bi-quad circuit of FIG. 1 configured with multiple-bit BRMs, such as the BRM illustrated in FIG. 1 and discussed above, is illustrated. The nomenclature is set to correspond with that of FIG. 1, emphasizing the similar configuration with different components. Each of the sigma delta devices illustrated in FIG. 7 are illustrated as multiple-bit BRMs, such as that illustrated in FIG. 1 and described above. Each of the integrators illustrated are configured with a first integrator adder 702, a second integrator adder 704, and an integrator flip flop 706. The integrators are configured to receive two inputs, and add them together with adder 702. The Flip flop 706 receives an output from the second adder 704 at its D input, and outputs a toggles Q output according to a clock (CLK) input. This Q output is then input to the second adder 704 and added with the output from the first adder 702.

The bi-quad circuit 700 is illustrated as a 16 bit configuration. However, this bit size is only illustrative, and those skilled in the art will recognize that various numbers of bits can be utilized to configure such a circuit. According to one embodiment of the invention, the filter 700 includes an input 102' configured to receive a multi-bit digital input signal, an output 104' configured to output a multi-bit output signal, and a feedback loop 106' communicating with a first BRM 108'. The filter further includes a feedback loop 106' that feeds back an output signal from fourth BRM 110' to the inverter input 112' of an first integrator 114'. The output of the input integrator is then transmitted to the second BRM 118'. The signal is then integrated with a signal that is fed back through the third BRM 120' and into inverter input 122' into second integrator 124'. In operation, an input signal is fed into the first sigma-delta device 108', then processed in the bi-quad configured sigma-delta loop 106' and finally output at the output 104'. Those skilled in the art will recognize that this loop is a second order feedback loop, where the two integrators are 114' and 124', the overall feedback operation being performed by the fourth BRM 110' and a damping term provided by third BRM 120'.

Thus, the multiple bit BRM is configured into a bi-quad filter, where the signal being processed through the circuit is represented as successive states of the multiple bit BRMs, where they operate within a larger fraction of the reference clock compared to single bit BRMs, and more bits are processed at a given time.

The invention has been described with reference to a bi-quad circuit that utilizes sigma delta devices as inputs to integrators, and has also been described as a multi-bit BRM that may be used in place of the sigma delta devices. It will be appreciated by those skilled in the art, however, that the invention has broader utility. Other embodiments may be implemented according to the invention without departing from the spirit and scope of the invention, the scope of which is to be construed in accordance with the following claims and their equivalents.

The invention claimed is:

1. A multiple bit BRM, comprising:

an input configured to receive a digital input signal;

an output configured to output a binary rate signal;

a first adder configured to receive a first portion of bits from the input signal, to add two signals, and to output a sum output signal and a carry output signal;

a flip flop circuit configured to output a toggle output in response to receiving a sum signal from the first adder, wherein the first adder is further configured to add the toggle output with the first portion of the input signal; and a second adder configured to add the carry output signal from the first adder to a second portion of the input signal and to output the binary rate signal.

* * * * *